United States Patent
Downs et al.

[19]

[11] Patent Number: 5,912,548
[45] Date of Patent: Jun. 15, 1999

[54] BATTERY PACK MONITORING SYSTEM

[75] Inventors: Richard E. Downs; Robert Mounger, both of Dallas, Tex.

[73] Assignee: Dallas Semiconductor Corp., Dallas, Tex.

[21] Appl. No.: 09/058,046

[22] Filed: Apr. 9, 1998

Related U.S. Application Data

[63] Continuation of application No. 08/688,444, Jul. 30, 1996.

[51] Int. Cl.$^6$ ...................................................... H02J 7/00
[52] U.S. Cl. ........................................... 320/150; 324/433
[58] Field of Search .................................... 320/150, 162, 320/112; 324/429, 433

[56] References Cited

U.S. PATENT DOCUMENTS

| | | | |
|---|---|---|---|
| 4,709,202 | 11/1987 | Koenck et al. | 320/43 |
| 5,250,893 | 10/1993 | Gambill et al. | 324/115 |
| 5,514,945 | 5/1996 | Jones | 320/14 |
| 5,570,004 | 10/1996 | Shibata | 323/303 |
| 5,754,037 | 5/1998 | Ezell et al. | 323/273 |

*Primary Examiner*—Peter S. Wong
*Assistant Examiner*—Gregory J. Toatley, Jr.
*Attorney, Agent, or Firm*—Jenkens & Gilchrist P.C.

[57] ABSTRACT

An electronic device for monitoring the operating conditions of a rechargeable battery, and includes a temperature monitor for monitoring the operating temperature of the rechargeable battery; a voltage determiner coupled to the rechargeable battery for measuring the potential level of the rechargeable battery; a one wire interface for outputting the information corresponding to the potential level of the rechargeable battery and the information corresponding to the temperature monitored by the temperature monitor; and a power regulator coupled to the rechargeable battery for supplying regulated power from the rechargeable battery to the temperature monitor and the voltage determiner. The voltage determiner includes an analog to digital converter and utilizes a successive approximation technique to determine and output a digital value corresponding to the potential level of the rechargeable battery.

9 Claims, 4 Drawing Sheets

BATTERY PACK MONITORING SYSTEM

This application is a continuation of application Ser. No. 08/688,444, filed Jul. 30, 1996.

PARTIAL WAVER OF COPYRIGHT PROTECTION

A portion of the disclosure of this patent document contains material which is subject to copyright protection. The copyright owner has no objection to the facsimile reproduction one of the patent disclosure by anyone, as it appears in the United States Patent and Trademark office patent files or records, but otherwise reserves all copyright rights whatsoever.

FIELD OF THE INVENTION

This invention relates to electronic devices, and more particularly to electronic devices for monitoring various operating conditions of a rechargeable battery in a rechargeable battery pack especially during the charging and discharging of the battery.

CROSS REFERENCE TO RELATED APPLICATIONS

This application is related to the following U.S. Patent Applications:

| APPLICATION SERIAL NO. | TITLE | INVENTOR(S) |
| --- | --- | --- |
| 08/688,589 | Auto Zero Circuitry and Associated Method | Richard William Ezell Robert Mounger |
| 08/688,479 | Digitally Adaptive Biasing Regulator | Richard William Ezell Robert Mounger |

All of the related applications are filed on even date herewith, are assigned to the assignee of the present invention, and are hereby incorporated herein in their entirety by this reference thereto.

BACKGROUND OF THE INVENTION

Many portable electronic systems, such as laptop computers and cellular phones, are powered by rechargeable batteries. Such batteries have the advantage that they are portable, relatively weight efficient, and can be charged and discharged many times. However, the high performance of these electronic systems require efficient utilization of the rechargeable battery. But due to certain characteristics of rechargeable batteries, the efficient and optimal control of rechargeable batteries is very difficult.

For example, a rechargeable battery that is fully charged needs to be maintained at maximum readiness by applying a very small current to the rechargeable battery. Further, with many rechargeable batteries, such as Ni—Cd batteries, the voltage of the rechargeable battery will drop at full charge. Therefore, it is very important to be able to communicate to a recharger system when the rechargeable battery is fully charged and has reached its optimal potential.

In addition, the operation of rechargeable batteries will be affected by operating temperature of the system utilizing the rechargeable battery. For example, a rate of discharge which is not excessive at one temperature may be excessive at another temperature.

As can be appreciated, the optimal management of the rechargeable battery whether during charging or discharging is very critical. For example, it is very desirable to monitor the potential level of a rechargeable battery in a laptop, so that if the potential level of the rechargeable battery falls below a certain threshold, the computer can be safely shut down before the computer crashes, potentially losing information. Therefore, the more information the electronic systems interfacing with the rechargeable battery have, the more efficiently the rechargeable battery as well as the electronic system itself can be utilized.

SUMMARY OF THE INVENTION

The present invention overcomes the above identified problems as well as other shortcomings and deficiencies of existing technologies by providing a single integrated circuit that can monitor the operating temperatures of a rechargeable battery as well as monitor the voltage potential levels of the rechargeable battery and easily output this information to the system interfacing with the rechargeable battery.

The present invention further provides a low powered electronic device for monitoring the operating conditions of a rechargeable battery. The electronic device is generally in a single package and a single integrated circuit. The electronic device includes a temperature monitor for monitoring the operating temperature of the rechargeable battery. The temperature information is stored in memory in the temperature monitor. The electronic device also includes a voltage determiner coupled to the rechargeable battery for measuring the voltage potential level of the rechargeable battery. The voltage determiner utilizes a comparator, a potentiometer and a successive approximation register to determine the voltage potential level of the rechargeable battery. The electronic device stores information corresponding to the potential level of the rechargeable battery in the memory of the temperature monitoring device. The electronic device also utilizes a one wire interface for communicating the information corresponding to the voltage potential level of the rechargeable battery and the information corresponding to the temperature monitored by the temperature monitor to an external device or processor. The electronic device further includes a power regulator coupled to the rechargeable battery. The power regulator supplies regulated power from the rechargeable battery to the temperature monitor, the one wire interface, and the voltage determiner. This permits low power circuitry to be coupled and draw power from the higher powered rechargeable battery.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION

Figure 1:
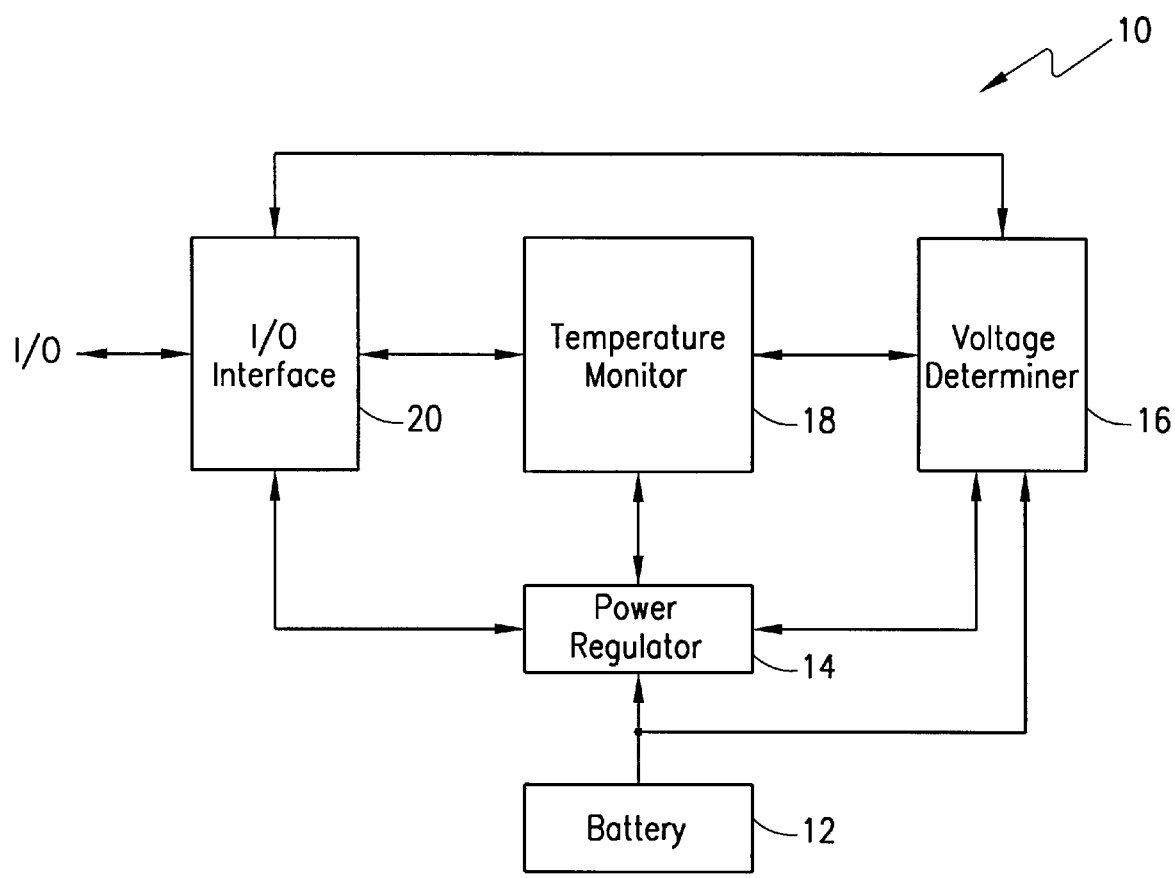
FIG. 1 is a block diagram of a battery pack utilizing the present invention.

Referring now to the drawings wherein like or similar elements are designated with identical reference numerals throughout the several views, and wherein the various elements depicted are not necessarily drawn to scale, and in particular, to FIG. 1, there is illustrated a block diagram depicting a battery pack 10 utilizing the present invention. In particular, battery pack 10 includes a rechargeable battery 12, a power regulator 14, a voltage determiner 16, a temperature monitor 18, and an input/output (I/O) interface 20. As depicted, rechargeable battery 12 is coupled to regulator 14 and voltage determiner 16. Power regulator 14 is further coupled between voltage determiner 16, temperature monitor 18 and I/O interface 20, and generally provides regulated operating power from rechargeable battery 12 to voltage determiner 16, temperature monitor 18 and I/O interface 20. I/O interface 20 is also coupled to temperature monitor 18 and voltage determiner 16, and generally communicates information to and from battery pack 10 as well as receives some parasitic power to perform certain critical functions at low power situations. Temperature monitor 18 is also coupled to voltage determiner 16, and generally monitors and records the operating temperature of battery pack 10. Voltage determiner 16, is coupled directly to battery 12, and generally measures the voltage potential of rechargeable battery 12.

It is contemplated to be within the scope of this invention to integrate I/O interface 20, temperature monitor, voltage determiner 16 and power regulator 14 into a single electronic package and well as to integrate them onto a single integrated circuit.

Figure 2:
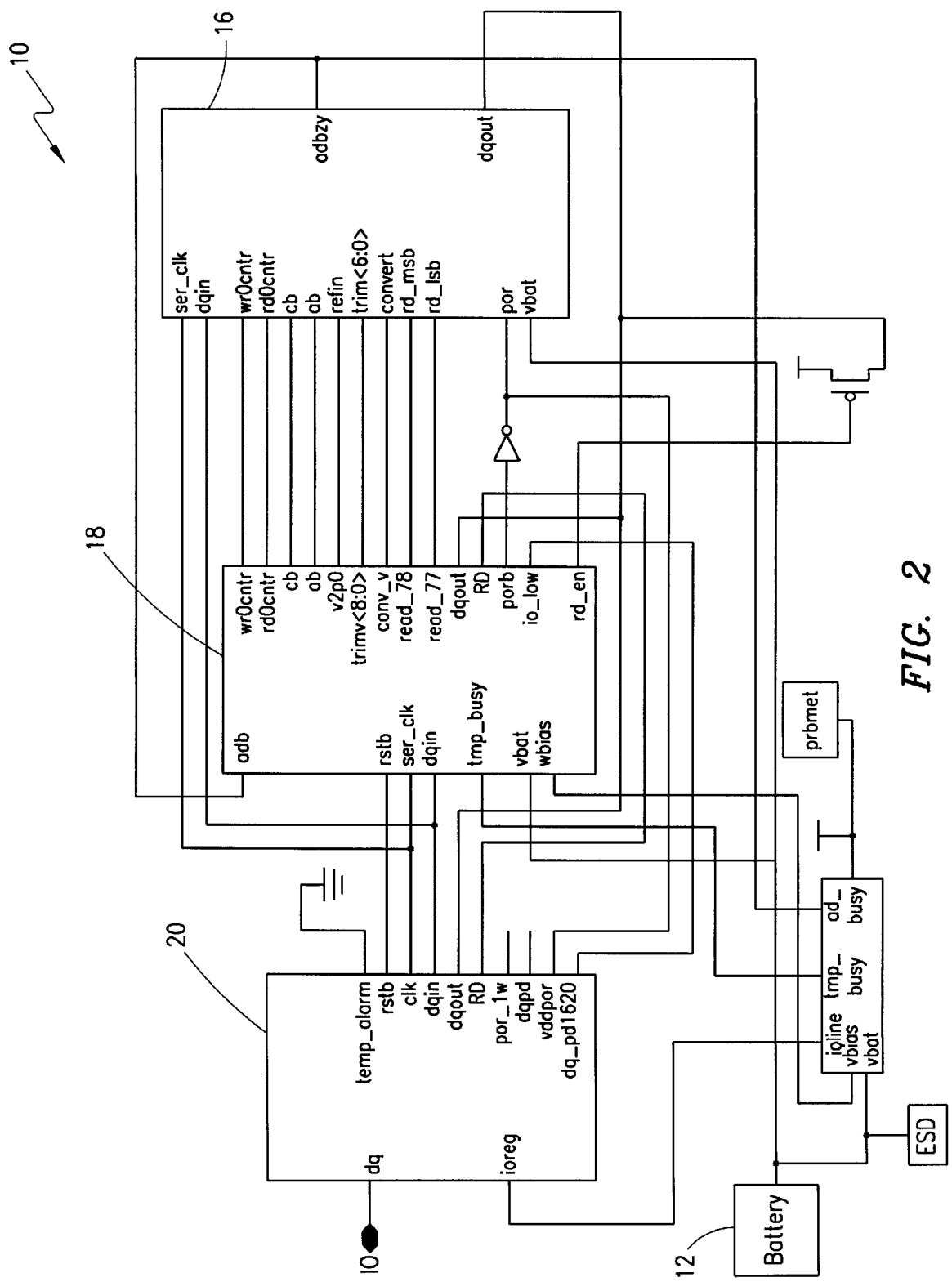
FIG. 2 is a more detailed schematic diagram of the components as similarly shown in FIG. 1.

Referring now to FIG. 2, there is illustrated a more detailed schematic block diagram of battery pack 10 as similarly shown in FIG. 1. Referring in particular to I/O interface 20, in a preferred embodiment I/O interface 20 utilizes a one wire port to communicate with the electronic system in which battery pack 10 is being utilized. Accordingly, a one wire bus is used to transfer data to and from battery pack 10. With a one wire interface, I/O interface 20 requires strict protocols to insure data transfer integrity.

Still referring to FIG. 2, temperature monitor 18 performs the function of monitoring the battery temperature. Temperature monitor 18 includes memory that stores the information relating to the monitoring of the battery temperature as well as other battery information including information relating to the charging parameters of the rechargeable battery and battery ID information.

In a preferred embodiment temperature monitor 18 measures the temperature of battery 12 without any external components. Temperature measurements are placed in memory registers for access by the electronic system through I/O interface 20. The temperature reading is provided in a 13-bit, two's complement reading, and is serially transmitted over the one wire interface of I/O interface 20. Temperature monitor 18 includes RAM and EEPROM which can be programmed the above described battery information as well as battery ID information.

Referring still to FIG. 2, power regulator 14 is coupled directly to rechargeable battery 12, and interfaces, regulates and supplies operating power from rechargeable battery 12 to I/O interface 20, temperature monitor 18, and voltage determiner 16. Power regulator 14 overcomes the limitation of having to connect I/O interface 20, temperature monitor 18, and voltage determiner 16 directly to a separate Vdd source and allows their connection to rechargeable battery 12. It further maintains low power consumption by these components by switching these components into a standby mode when not being utilized. A more detailed description of a preferred power regulator is described in detail in U.S. Patent Application, attorney docket no. 20661/00500, entitled "Digitally Adaptive Biasing Regulator", which is incorporated herein by reference.

Still referring to FIG. 2, voltage determiner 16 is coupled directly to rechargeable battery 12 and determines the voltage potential of rechargeable battery 12. Voltage determiner 16 includes an analog-to-digital converter (see FIG. 3) for performing a conversion when instructed to do so by a command received from I/O interface 20. The result of the measurement is placed in a voltage memory register, which is located in temperature monitor 18. This information is accessible by external devices through I/O interface 20.

Figure 3:
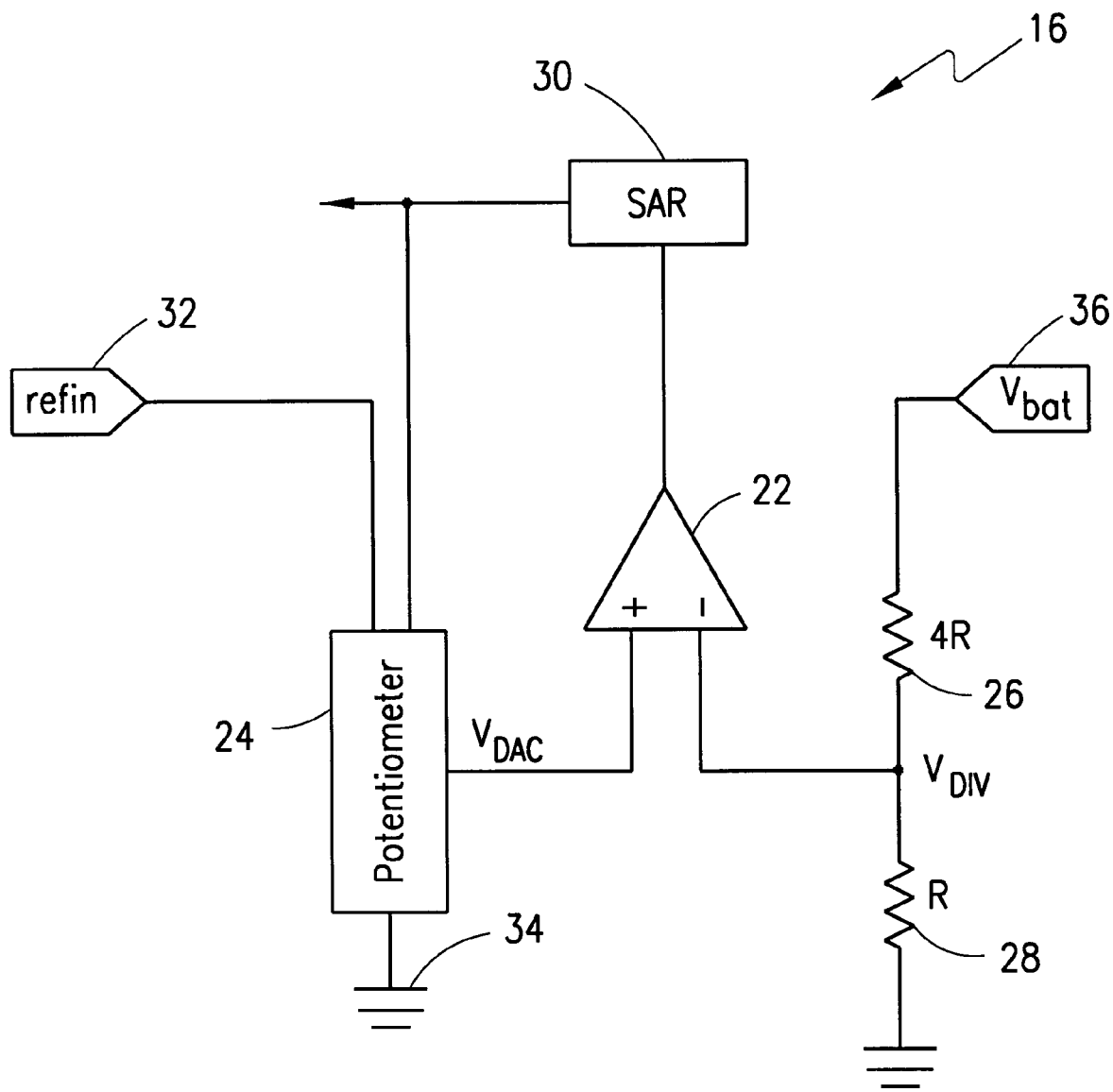
FIG. 3 is a schematic diagram of the voltage determiner of the present invention.

Referring now to FIG. 3, there is illustrated a more detailed schematic diagram of voltage determiner 16. As depicted voltage determiner 16 includes a comparator 22 with one of its inputs coupled to a variable potentiometer 24 and the other of its inputs coupled to the node defined between two resistors 26 and 28. The output of comparator 22 is coupled to a successive approximation register (SAR) 30. Potentiometer 24 is coupled between input 32, an input of comparator 22, SAR 30, and ground 34. Potentiometer 24 receives a reference voltage from input 32 and outputs a voltage $V_{DAC}$ to be compared at an input of comparator 22. Resistor 26 is coupled to rechargeable battery 12 at input 36. Resistors 26 and 28 act as a voltage divider for the voltage received from rechargeable battery 12 to supply the other voltage $V_{DIV}$ to be compared at the other input of comparator 22. SAR 30 monitors the output of comparator 22 and performs a successive approximation of the voltage potential of battery 12 by varying the resistance of potentiometer 24 in a selected fashion, such as from the most significant bit to the least significant bit. This procedure, which is described in greater detail below, determines and outputs the voltage of rechargeable battery 12.

Figure 4:
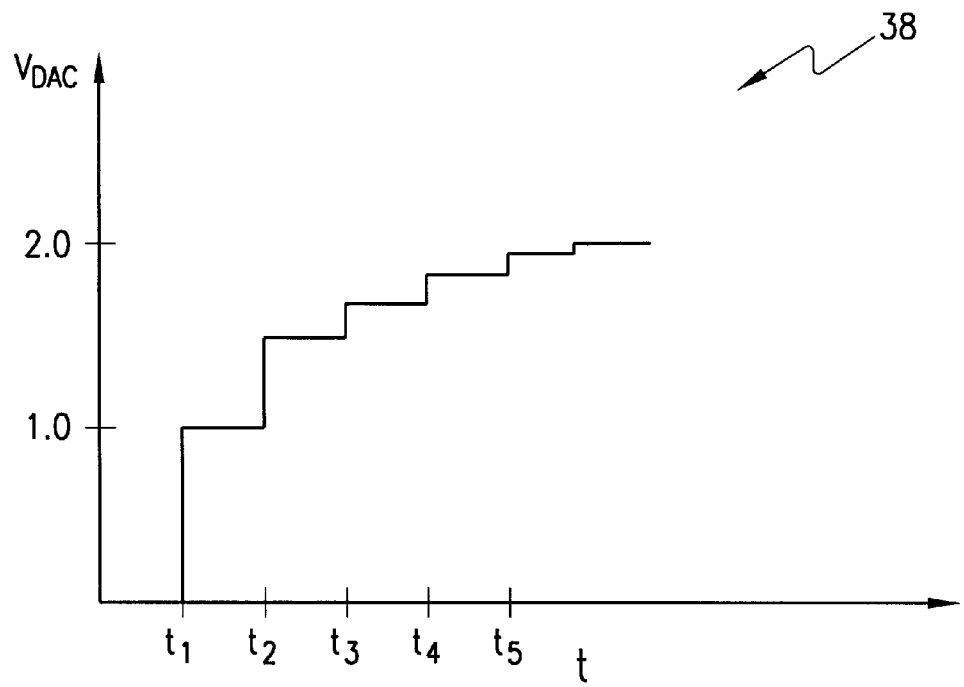
FIG. 4 is a graph illustrating an example of the operation of the voltage determiner of the present invention.

Referring now to FIG. 4 there is illustrated a graph 38 of $V_{DAC}$ versus time depicting an example of the operation of voltage determiner 16. Similarly, FIG. 5 illustrates a graph 40 of $V_{DAC}$ versus time depicting a second example of the operation of voltage determiner 16.

Figure 5:
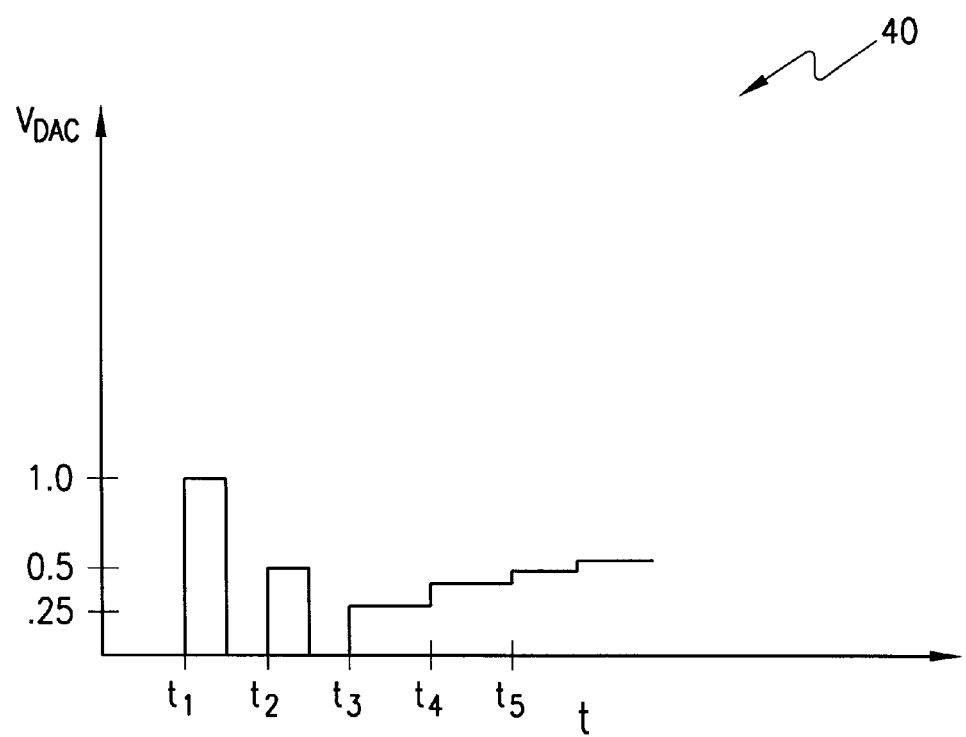
FIG. 5 is a graph illustrating another example of the operation of the voltage determiner of the present invention.

Referring now to FIGS. 3–5, the operation of voltage determiner 16 will now be described. In operations, for example, the reference voltage received at input 32 of voltage comparator will be 2 volts. The 2 volts is then trimmed by potentiometer 24 to produce $V_{DAC}$. Referring to the graph illustrated in FIG. 4, if the voltage being supplied to input 36 from rechargeable battery 12 is 10 volts, the resistor string made of resistors 26 and 28 will divide the voltage so that the voltage at $V_{DIV}$ is 2 volts. When voltage determiner 12 receives a signal to do a voltage determination, potentiometer 24 resets and the voltage at $V_{DAC}$ will be zero until time $t_1$, as indicated on graph 4. Then at time $t_1$, the most significant bit of potentiometer 24 is selected, such that potentiometer 24 outputs a voltage of 1 volt at $V_{DAC}$. $V_{DAC}$ and $V_{DIV}$ are then compared by comparator 22 and the output of comparator 22 is monitored. Since $V_{DAC}$ is lower than $V_{DIV}$, the next bit of potentiometer 24 is chosen at time $t_2$, raising $V_{DAC}$ by 50 percent to 1.5 volts. A comparison is made and the output of comparator 22 is still zero. $V_{DAC}$ is still lower that $V_{DIV}$ (1.5 V vs. 2.0 V respectively). This process is repeated for each of the next bits of potentiometer 24. As each bit is selected the increased voltage steps become smaller and smaller. $V_{DAC}$ then gradually converges on the 2 volts of $V_{DIV}$ which is determinative of the 10 volts of rechargeable battery 12.

Referring now to graph 40 illustrated in FIG. 5. If the voltage being supplied to input 36 from rechargeable battery 12 is 2.45 volts, the resistor string made of resistors 26 and 28 divides the voltage so that the voltage at $V_{DIV}$ is 0.49 volts. When voltage determiner 12 receives a signal to do a voltage determination, potentiometer 24 resets so that the voltage at $V_{DAC}$ will be zero, as indicated on the graph of FIG. 5. Then at time $t_1$, the most significant bit of potentiometer 24 is selected outputting a voltage of 1 volt at $V_{DAC}$. $V_{DAC}$ and $V_{DIV}$ are then compared by comparator 22 and the output of comparator 22 is monitored. Since $V_{DAC}$ is higher than $V_{DIV}$ (1V vs. 0.49 V, respectively), and the output of comparator 22 flips. The most significant bit of potentiometer 24 is reset to zero, taking $V_{DAC}$ back to ground and zero volts. At time $t_2$ the next bit of potentiometer 24 is chosen, whereby potentiometer 24 outputs 0.5 V for $V_{DAC}$. $V_{DAC}$ still is higher than $V_{DIV}$ (0.5 V vs. 0.49 V respectively), and the output of comparator 22 flips. This bit is also reset to zero, taking $V_{DAC}$ back to ground and zero volts. Then at time $t_3$ the next bit or third bit of potentiometer 24 is chosen, with potentiometer 24 now outputting about 0.25 volts. A comparison is made and now the output of comparator 22 is zero. $V_{DAC}$ is now lower that $V_{DIV}$ (0.25 V vs. 0.49 V respectively). The next bit of potentiometer 24 is chosen at time $t_4$ such that $V_{DAC}$ is 50 percent greater than 0.25 volts. A comparison is made and the process is repeated for each of the next bits. As described above, as each bit of potentiometer 24 is selected the increases in voltage steps become smaller and smaller. $V_{DAC}$ then gradually converges on the 0.49 volts of $V_{DIV}$ which is determinative of the 2.45 volts of rechargeable battery 12.

CONCLUSION

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. An electronic device for monitoring operating conditions of a portable rechargeable power supply in a housing, said electronic device comprising:

a monitor for monitoring the temperature of the rechargeable power supply;

a determiner coupled to the rechargeable power supply, said determiner including an analog-to-digital converter for determining the potential level of the power supply;

said analog-to-digital converter including a potentiometer having an input for receiving a reference potential and an output for outputting a selected reduced potential dependent upon the reference potential and further dependent upon the resistance value of said potentiometer;

said analog-to-digital converter further including a comparator having an output and first and second inputs, said first input being coupled to said potentiometer to receive the selected reduced potential outputted by said potentiometer, and said second input being connected to said rechargeable power supply, said comparator for comparing the output of said potentiometer with the potential of said rechargeable power supply;

said determiner further including a successive approximation register coupled between said potentiometer and said output of said comparator, said successive approximation register for controlling the resistance value of said potentiometer in response to said output of said comparator;

an interface for outputting information corresponding to the potential level of the rechargeable power supply determined by said determiner and further for outputting information corresponding to the temperature monitored by said monitor; and a regulator coupled to the rechargeable power supply, said monitor, said interface and said determiner, said regulator for supplying regulated operating power from said rechargeable power supply to each of said monitor, said determiner, and said interface.

2. The electronic device as recited in claim 1, wherein: said analog to digital converter includes a voltage divider coupled between said second input of said comparator and said rechargeable power supply.

3. The electronic device as recited in claim 2, wherein: said successive approximation register for varying the resistance value of said potentiometer from a most significant bit of said potentiometer to a least significant bit of said potentiometer.

4. The electronic device as recited in claim 3, wherein said interface includes a single wire interface bus for outputting information.

5. An integrated circuit for monitoring operating conditions of a rechargeable battery in a battery pack, said electronic device comprising:

a temperature monitor for monitoring the temperature of the rechargeable battery;

a voltage determiner coupled to the rechargeable battery, said voltage determiner including an analog-to-digital converter for determining the voltage level of the rechargeable battery;

said analog-to-digital converter including a potentiometer having an input for receiving a reference potential and an output for outputting a selected reduced potential dependent upon the reference potential and further dependent upon the resistance value of said potentiometer;

said analog-to-digital converter further including a comparator having an output and first and second inputs, said first input being coupled to said potentiometer to receive the selected reduced potential outputted by said potentiometer, and said second input being connected to said rechargeable power supply, said comparator for comparing the output of said potentiometer with the potential of said rechargeable power supply;

said determiner further including a successive approximation register coupled between said potentiometer and said output of said comparator, said successive approximation register for controlling the resistance value of said potentiometer in response to said output of said comparator; and a regulator coupled to the rechargeable battery, said temperature monitor, and said voltage determiner, said regulator for supplying regulated operating power from said rechargeable battery to each of said temperature monitor, and said voltage determiner.

6. The integrated circuit as recited in claim 5, and further comprising:

an interface for outputting information corresponding to the voltage level of the rechargeable battery determined by said voltage determiner and further for outputting information corresponding to the temperature monitored by said temperature monitor.

7. The integrated circuit as recited in claim 6, wherein said interface utilizes a single wire interface bus for outputting information.

8. The integrated circuit as recited in claim 5, wherein:

said analog to digital converter includes a voltage divider said voltage divider being coupled to said input of said analog to digital converter for dividing down the potential received by a selected amount.

9. An integrated circuit for monitoring operating conditions of a rechargeable battery in a battery pack, said electronic device comprising:

a temperature monitor for monitoring the operation temperature of the rechargeable battery;

a voltage determiner coupled to the rechargeable battery, said voltage determiner including an analog-to-digital converter for determining the voltage level of the rechargeable battery;

said analog-to-digital converter including a potentiometer having an input for receiving a reference potential and an output for outputting a selected reduced potential dependent upon the reference potential and further dependent upon the resistance value of said potentiometer;

said analog-to-digital converter further including a comparator having an output and first and second inputs, said first input being coupled to said potentiometer to receive the selected reduced potential outputted by said potentiometer, and said second input being connected to said rechargeable power supply, said comparator for comparing the output of said potentiometer with the potential of said rechargeable power supply;

said determiner further including a successive approximation register coupled between said potentiometer and said output of said comparator, said successive approximation register for controlling the resistance value of said potentiometer in response to said output of said comparator; and a regulator coupled to the rechargeable battery, said temperature monitor, and said voltage determiner, said regulator for supplying regulated power from said rechargeable battery to each of said temperature monitor, and said voltage determiner.

* * * * *